(12) United States Patent
Sakairi

(10) Patent No.: US 7,134,881 B1
(45) Date of Patent: Nov. 14, 2006

(54) LAND GRID ARRAY CONNECTOR AND PACKAGE MOUNT STRUCTURE

(75) Inventor: Makoto Sakairi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 11/393,649

(22) Filed: Mar. 31, 2006

(30) Foreign Application Priority Data

Dec. 14, 2005 (JP) ............................. 2005-360705

(51) Int. Cl.
*H01R 12/00* (2006.01)
*H05K 1/00* (2006.01)

(52) U.S. Cl. ..................... 439/66; 439/91; 439/591
(58) Field of Classification Search ................. 439/66, 439/91, 591
See application file for complete search history.

(56) References Cited

U.S. PATENT DOCUMENTS

| 5,334,872 | A |   | 8/1994  | Ueda et al. |         |
|-----------|---|---|---------|-------------|---------|
| 5,967,798 | A | * | 10/1999 | Tustaniwskyj et al. | 439/66 |
| 6,028,497 | A |   | 2/2000  | Allen et al. |        |
| 6,146,152 | A | * | 11/2000 | McHugh et al. | 439/66 |
| 6,302,702 | B1 | * | 10/2001 | Audet et al. | 439/66 |
| 6,354,844 | B1 | * | 3/2002  | Coico et al. | 439/66 |
| 6,370,770 | B1 |   | 4/2002  | Fan et al. |        |
| 6,477,058 | B1 | * | 11/2002 | Luebs et al. | 361/784 |
| 6,916,181 | B1 | * | 7/2005  | Brown et al. | 439/66 |
| 6,930,884 | B1 |   | 8/2005  | Cromwell et al. |   |
| 6,958,616 | B1 | * | 10/2005 | Mahoney et al. | 324/754 |
| 6,994,565 | B1 | * | 2/2006  | Harper, Jr. | 439/66 |
| 2004/0016748 | A1 |  | 1/2004 | Kinoshita et al. |  |

FOREIGN PATENT DOCUMENTS

JP    2001-143828    5/2001
JP    2001-143829    5/2001

* cited by examiner

*Primary Examiner*—Hae Moon Hyeon
(74) *Attorney, Agent, or Firm*—Armstrong, Kratz, Quintos, Hanson & Brooks, LLP

(57) ABSTRACT

A Land Grid Array connector for connecting a Land Grid Array package mounted on a package board with a printed board. The Land Grid Array connector includes columns for conduction between the electrode of the Land Grid Array package and the electrode of the printed board and a socket supporting the columns. The Land Grid Array connector also includes a structure in which the columns receive an even load when the Land Grid Array package is mounted.

7 Claims, 7 Drawing Sheets

LAND GRID ARRAY CONNECTOR AND PACKAGE MOUNT STRUCTURE

BACKGROUND OF THE INVENTION

1. Field of the Invention

The present invention relates to a Land Grid Array ("LGA") connector and a package mount structure for conduction between an LGA package and a system board.

2. Description of the Related Art

Systems for conduction between a package and a system board include a ball grid array (BGA) system in which a package is soldered directly to a board and a land grid array (LGA) connector system. The BGA system has the problems of heat generated at connection and the time and cost for replacement, while the LGA connector system needs only works at room temperature and facilitates replacement because of a configuration to provide conduction by pressure.

FIG. 1 shows a package mount structure of a related art (in sectional view). FIG. 2 shows the package mount structure of the related art (in plan view).

The package mount structure has a configuration in which a heatsink base 52, a lid or heat spreader 53, and a bolster plate 57 are pressed by tightening them with screws 58 with a spring 59. Principally, the outer four corners of an LGA package 54 are pressed to clamp an LGA connector 51 between a package board 55 that mounts the LGA package 54 and a system board 56.

The LGA connector 51 is pressed with the screws 58 at the four corners to collapse columns 61 of the LGA connector 51, so that the electrodes of the package board 55 and the system board 56, and a silver filler among the columns 61 are brought into conduction, thereby providing conduction between the LGA package 54 and the system board 56.

The LGA connector 51 is sandwiched between the heatsink base 52 and the bolster plate 57, and the outer four corners of the LGA package 54 are pressed with screws. Accordingly, the load on the columns 61 is not even, i.e., the load on the outer side adjacent to the four corners is large, and the load on the inside is small.

Since a socket 62 of the LGA connector 51 is made of a low-rigidity resin material such as polyimide in the present circumstances, it is deformed under a load to cause unevenness in load on the columns 61.

Since the LGA connector 51 is screwed at four portions in sequence and pressed with the springs 59 at assembling, it is difficult to provide sufficient parallelism.

For these reasons, if the load imposed on some of the columns 61 is low, there is a possibility of nonconduction.

SUMMARY OF THE INVENTION

According to the invention, there is provided an LGA connector for connecting an LGA package mounted on a package board with a printed board, the LGA connector includes columns for conduction between the electrode of the LGA package and the electrode of the printed board and a socket supporting the columns, and the LGA connector includes a structure in which the columns receive an even load when the LGA package is mounted.

DESCRIPTION OF THE PREFERRED EMBODIMENTS

First Embodiment

Figure 3:
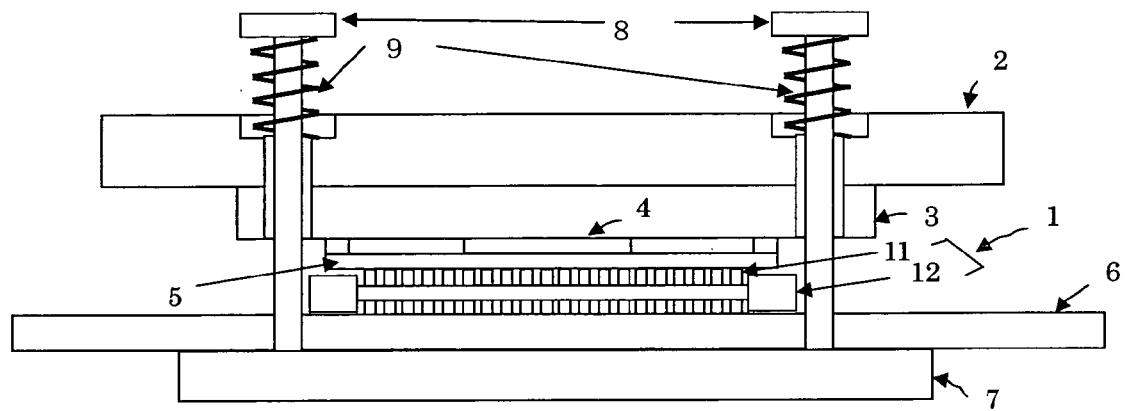
FIG. 3 shows a package mount structure according to an embodiment (in sectional view).

FIG. 3 shows a package mount structure according to an embodiment (in sectional view).

The mount structure for a land grid array (LGA) package 4 is a layer structure in which a heatsink base 2, a lid or heat spreader 3, the LGA package 4, a package board 5, an LGA connector 1, a system board 6, and a bolster plate 7 are layered in this order, which are pressed with screws 8 with a spring 9.

The LGA package 4 and the system board 6 are brought into conduction in such a manner that the electrode of the package board 5 and columns 11 of the LGA connector 1, and the columns 11 of the LGA connector 1 and the electrode of the system board 6 are placed one on another in the direction of thickness.

The heatsink base 2 is an aluminum plate for pressing the connection between the package board 5 and the LGA connector 1, and mounts a heatsink for heat radiation (not shown).

The size is, for example, about 74 mm wide×62 mm deep×7 mm thick.

The lid or heat spreader 3 is for transferring the heat of the LGA package 4 to the heatsink via the heatsink base 2 while providing flatness of the package board 5. The size is, for example, about 60 mm wide×60 mm deep×8.65 mm thick.

The LGA package 4 is a semiconductor chip.

The package board 5 mounts the LGA package 4, and electrically connects the LGA connector 1 with the electrode of the LGA package 4. The material of the package board 5 is, for example, ceramic or FR-4. The size is, for example, about 42.5 mm wide×42.5 mm deep×1.6 mm thick.

The LGA connector 1 includes the columns 11 and a socket 12. The size is, for example, about 47 mm wide×47 mm deep. The columns are about 2.35 mm in height.

The columns 11 are made of flexible rubber, for example, silicon-silver filler composites. The socket 12 is made of insulated rigid metal such as copper or a resin material having a rigidity higher than that of a polyimide resin material.

The LGA connector 1 has the package board 5 on the top thereof, and the system board 6 thereunder. The columns 11 connect the circuit of the LGA package 4 and the system board 6 to each other in such a manner that the electrode on the package board 5 and the electrode on the package board 5 are brought into contact and conduction with each other with both sides of the columns 11.

The system board 6 is made of, for example, FR-4 to constitute various circuits. The size is, for example, about 70 mm wide×60 mm deep×3.2 mm thick.

The bolster plate 7 is a stainless steel plate for pressing the connection between the package board 5 and the LGA connector 1. The size is, for example, about 64 mm wide×52 mm deep×3 mm thick.

When the screws 8 with the spring 9 are screwed up, the layers from the heatsink base 2 to the bolster plate 7 are pressed to stable the contact between the LGA connector 1 and the package board 5. The interval between the screws 8 is, for example, 50 mm wide and 35 mm deep. Four screws are normally used.

FIG. 4 shows the structure of the LGA connector according to the first embodiment.

The LGA connector 1 includes the columns 11 and the socket 12.

Figure 4A:
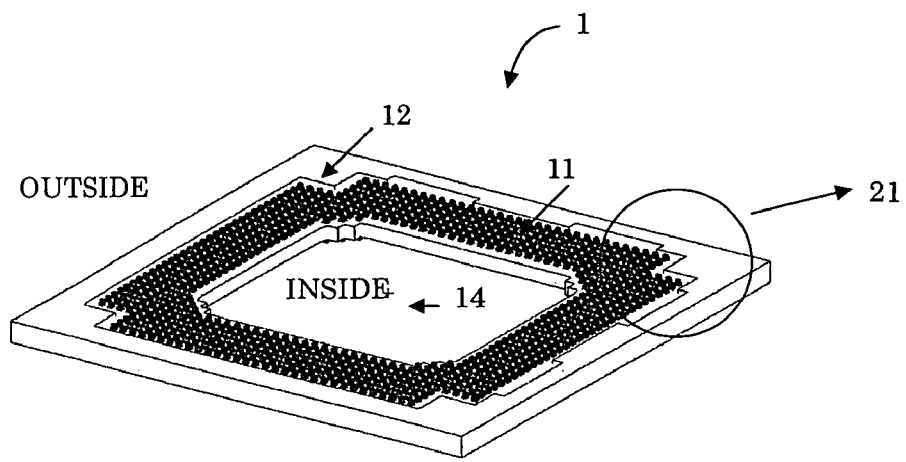
FIGS. 4A to 4C is a schematic diagram of an LGA connector according to an embodiment.
Figure 4B:
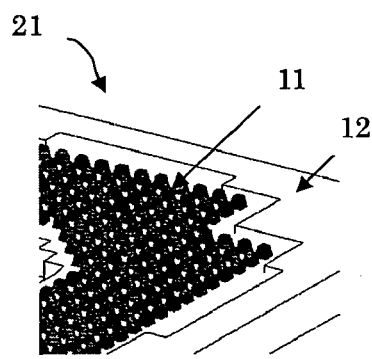
Figure 4C:
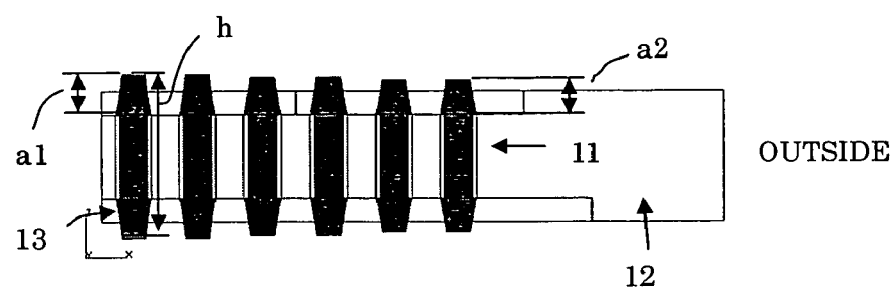

As shown in FIGS. 4A, 4B, and 4C, the LGA connector 1 has a structure in which vertically projecting columns 11 pass through the substantially square-plate-like socket 12 in a grid pattern. The socket 12 has a substantially square opening 14 so as to prevent the collision of the components on the package board 5.

The LGA connector 1 or the mount structure will be described in which the load imposed on the columns 11 is increased in evenness.

The LGA connector 1 has a structure in which the projections 13 of the columns 11 decrease in height from the opening 14 in the center of the LGA connector 1 toward the outside. As shown in FIG. 4C, the height a2 of the outer projection 13 is smaller than the height a1 of the inner projection 13. As a result, the height h of the columns decreases from the opening 14 in the center of the LGA connector 1 toward the outside.

In this case, the difference among the projections 13 of the columns 11 is determined in accordance with the relationship with the rigidity of the upper and lower members that press the LGA connector 1. As a result, an even load is imposed across the inside toward the outside of the LGA connector 1.

Figure 7:
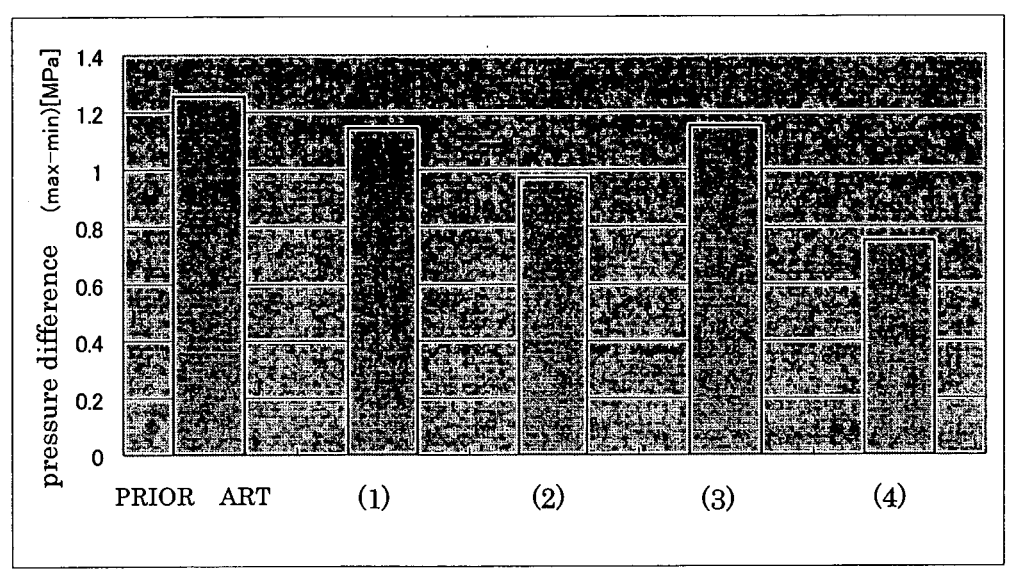
FIG. 7 shows a comparison among the pressure differences in the height direction of the columns according to embodiments.

FIG. 7 shows a simulated comparison among the pressure differences in the height direction of the columns according to embodiments.

Figure 1:
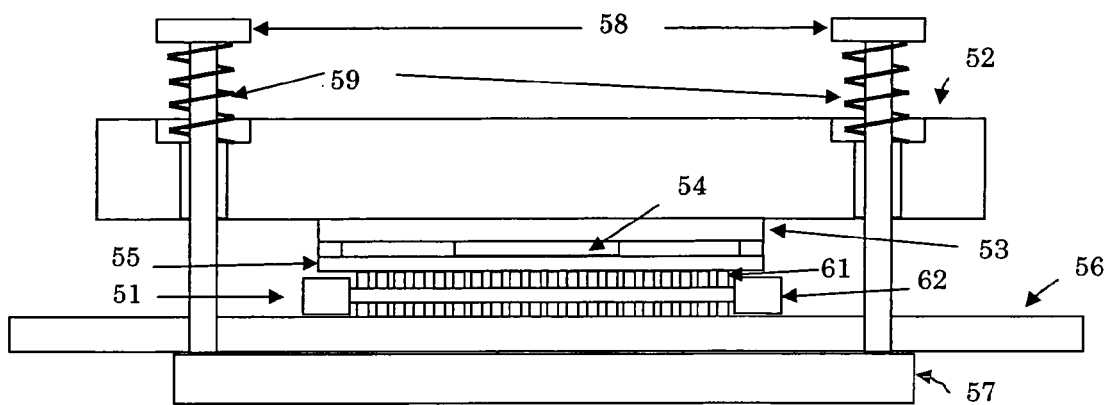
FIG. 1 shows a package mount structure of a related art (in sectional view).
Figure 2:
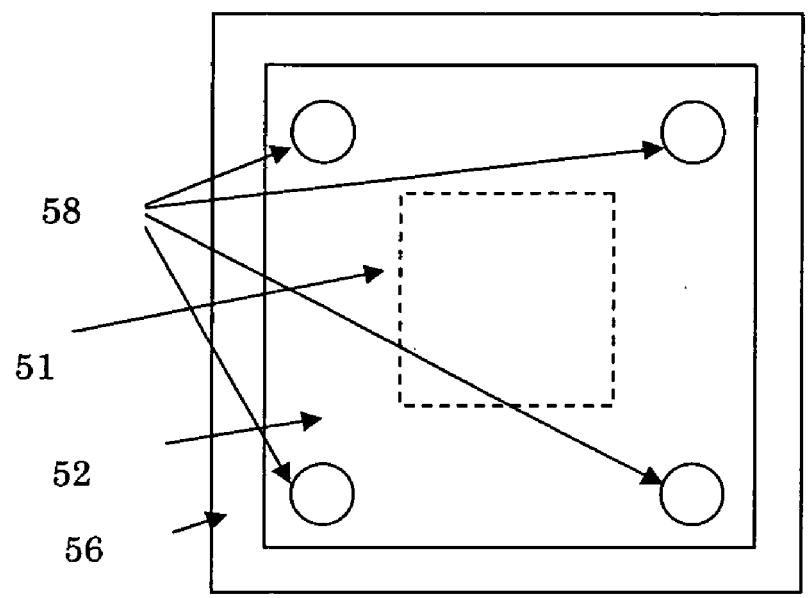
FIG. 2 shows the package mount structure of the related art (in plan view).

The pressure distribution of the columns 61 of the related art in FIG. 1 is −2.594 MPa (in pressure unit) at the maximum and −3.852 MPa at the minimum, and the difference between the maximum value and the minimum value is 1.262 MPa. This is indicated in 'Related Art' in FIG. 7.

The simulation of the related art is conducted under the following conditions.

The heatsink base 2 is made of an aluminum plate, whose size is about 74 mm wide×62 mm deep×7 mm thick.

The lid or heat spreader 3 is made of a copper plate, whose size is about 42.5 mm wide×42.5 mm deep×2.7 mm thick.

The package board 5 is made of FR-4, whose size is about 42.5 mm wide×42.5 mm deep×1.6 mm thick.

The size of the LGA connector 1 is about 47 mm wide×47 mm deep. The columns have the same height of about 2.35 mm. The columns 11 are made of silicon-silver filler composites. The socket 12 is made of a resin material such as polyimide.

The system board 6 is made of FR-4, whose size is 70 mm wide×60 mm deep×3.2 mm thick.

The bolster plate 7 is made of a stainless steel plate, whose size is about 64 mm wide×52 mm deep×3 mm thick.

The interval between the screws is set to be disposed at the four corners of the bolster plate 7.

The following simulation is different from that of the related art only in the condition of the heights of the columns 11.

The pressure distribution in the height direction of the columns 11 when the difference between the inner and outer columns 11 is 10 μm is −2.591 MPa at the maximum and −3.711 MPa at the minimum, and the difference between the maximum value and the minimum value is 1.12 MPa.

Accordingly, the value is smaller than the difference 1.262 MPa between the maximum value and the minimum value of the related art, which indicates that the pressure distribution is more even than that of the related art.

FIG. 7(1) shows the result of the simulation.

Second Embodiment

Figure 5:
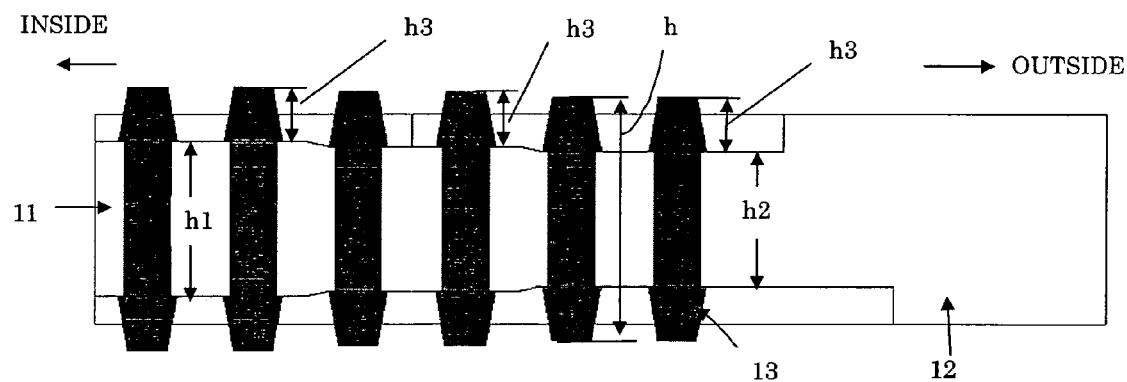
FIG. 5 is an explanatory diagram of a socket according to an embodiment.

FIG. 5 is an explanatory diagram of the structure of a socket according to a second embodiment.

This is a method for varying the height of the socket 12 that sandwiches the columns without changing the height h3 of the projections 13 of the columns 11. The height h2 on the outer side is smaller than the height h1 on the inner side. This is a structure in which the height of the socket decreases from the opening 14 in the center of the LGA connector toward the outside. In other words, the height h of the columns 11 decreases from the opening 14 in the center of the LGA connector toward the outside. This structure has the advantages as those when only the height of the projections of the columns 11 is changed.

Third Embodiment

The lid or heat spreader 3 is made larger than the package board 5. Specifically, it is increased in size to the position at which it can be fixed with the screws 8 while holding rigidity. Furthermore, the positions at which it is pressed with the screws 8 are brought close to the LGA connector 1 as much as possible. FIG. 3 shows an example of this structure.

In this embodiment, a simulation is performed in which only the interval between the lid or heat spreader 3 and the screws is changed from the simulation conditions of the related art.

The size of the lid or heat spreader 3 is about 60 mm wide×60 mm deep×8.65 mm thick. The interval among the screws is 50 mm wide×35 mm deep.

The pressure distribution of this structure is −2.725 MPa at the maximum and −3.698 MPa at the minimum, and the difference between the maximum value and the minimum value is 0.973 MPa.

This shows that the value is smaller than the difference 1.262 MPa between the maximum value and the minimum value of the related art, which indicates that the pressure distribution is more even than that of the related art. FIG. 7(2) shows the result of the simulation.

Fourth Embodiment

The socket 12 of the LGA connector 1 is made of insulated rigid metal or a high-rigidity resin material. An example of the insulated rigid metal is copper. Examples of the rigid resin material include engineering plastic, such as polyethersulfone (PES) and polyetheretherketone (PEEK).

In this embodiment, a simulation is performed in which only the material of the socket is changed from the simulation conditions of the related art.

The pressure distribution of this structure is −2.636 MPa at the maximum and −3.790 MPa at the minimum, and the difference between the maximum value and the minimum value is 1.154 MPa.

This shows that the value is smaller than the difference 1.262 MPa between the maximum value and the minimum value of the related art, which indicates that the pressure distribution is more even than that of the related art. FIG. 7(3) shows the result of the simulation.

Fifth Embodiment

The pressure distribution of the structure of the combination of the first, third, and fourth embodiments is −2.804 MPa at the maximum and −3.555 MPa at the minimum, and the difference between the maximum value and the minimum value is 0.751 MPa.

This shows that the value is smaller than the difference 1.262 MPa between the maximum value and the minimum value of the related art, which indicates that the pressure distribution is more even than that of the related art. FIG. 7(4) shows the result of the simulation.

Sixth Embodiment

Figure 6:
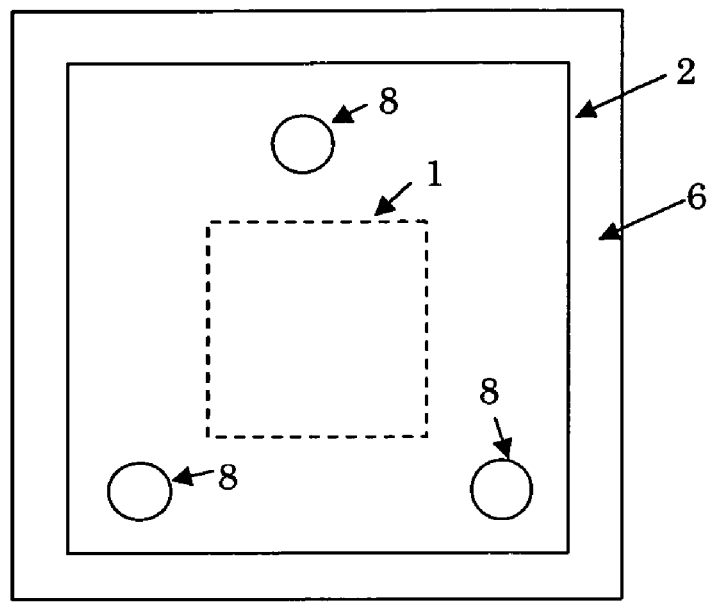
FIG. 6 shows a package mount structure according to an embodiment (in plan view).

FIG. 6 shows a package mount structure according to an embodiment (in plan view).

In this structure, pressure is applied not to four portions but to three portions. This is because, for four portions, the center of the mount structure tends to expand by screwing to cause contact failure between the columns 11 and the electrodes; for three portions, the pressure distribution is more likely to become even.

With the mount structures, an even load is imposed on the columns 11. This eliminates the problem of nonconduction due to the low load, thus improving reliability of connection.

What is claimed is:

1. A Land Grid Array (LGA) connector connecting an LGA package mounted on a package board with a printed board, the LGA connector comprising:
   columns for conduction between electrodes of the LGA package and electrodes of the printed board, said columns receiving an even load upon mounting the LGA package; and
   a socket supporting the columns,
   wherein the heights from the socket of portions of the columns projecting externally from the socket decrease from an opening in the center of the LGA connector toward the outside.

2. The LGA connector according to claim 1 wherein the socket is made of an insulated high-rigidity metallic material or a high-rigidity resin material.

3. A Land Grid Array (LGA) connector connecting a LGA package mounted on a package board with a printed board, the LGA connector comprising:
   columns for conduction between electrodes of the LGA package and electrodes of the printed board, said columns receiving an even load upon mounting the LGA package; and
   a socket supporting the columns, wherein
   the heights from the socket of portions of the columns projecting externally from the socket are the same and the height of the socket decreases from an opening in the center of the LGA connector toward the outside.

4. A package mount structure comprising:
   a package board that mounts a Land Grid Array (LGA) package;
   a printed board connected to the package board;
   an LGA connector including columns for conduction between electrodes of the LGA package and electrodes of the printed board and a socket supporting the columns, said columns receiving an even load upon mounting the LGA package, the heights from the socket of portions of the columns projecting externally from the socket, said heights of the columns decreasing from an opening in the center of the LGA connector toward the outside;
   a plate disposed on the top of the LGA package and a plate under the printed board, for pressing the columns; and
   board, and the plate under the printed board, for pressing the columns.

5. The package mount structure according to claim 4, wherein the screws with a spring are located close to the LGA connector.

6. The package mount structure according to claim 5, wherein the screws with a spring are disposed at three portions.

7. A package mount structure comprising:
   a package board that mounts a Land Grid Array (LGA) package;
   a printed board connected to the package board;
   an LGA connector including columns for conduction between electrodes of the LGA package and electrodes of the printed board and a socket supporting the columns, said columns receiving an even load upon mounting the LGA package, the heights from the socket of portions of the columns projecting externally from the socket being the same and the height of the socket decreasing from an opening in the center of the LGA connector toward the outside;
   a plate disposed on the top of the LGA package and a plate under the printed board, for pressing the columns; and
   screws with a spring passing through the plate on the top of the LGA package, the printed board, and the plate under the printed board, for pressing the columns.

* * * * *